United States Patent [19]

Shimizu

[11] Patent Number: 5,635,707

[45] Date of Patent: Jun. 3, 1997

[54] PHOTOELECTRIC CONVERSION DEVICE FOR USE IN SENSING LIGHT REFLECTED FROM MEDIUM SURFACE

[75] Inventor: Kousaku Shimizu, Tokyo, Japan

[73] Assignee: NEC Corporation, Japan

[21] Appl. No.: 452,878

[22] Filed: May 30, 1995

[30] Foreign Application Priority Data

May 30, 1994 [JP] Japan .................. 6-116374

[51] Int. Cl.[6] .................. H01J 40/14; H01L 27/14; H04N 1/024
[52] U.S. Cl. .................. 250/214.1; 250/208.1; 358/494; 257/184; 257/435
[58] Field of Search .................. 250/208.1, 214 R, 250/214.1; 257/40, 43, 98, 184, 294, 431, 435, 680; 358/494, 471, 482, 483; 348/294

[56] References Cited

U.S. PATENT DOCUMENTS

| | | | |
|---|---|---|---|
| 4,689,652 | 8/1987 | Shimada et al. | 357/30 |
| 4,892,613 | 1/1990 | Motai et al. | 156/643 |
| 4,908,718 | 3/1990 | Shimada | 358/494 |
| 5,036,206 | 7/1991 | Frank | 250/467.1 |
| 5,079,334 | 1/1992 | Epstein et al. | 528/210 |
| 5,128,532 | 7/1992 | Itabashi et al. | 250/208.1 |
| 5,198,685 | 3/1993 | Kitani et al. | 257/82 |
| 5,352,883 | 10/1994 | Kitani et al. | 250/208.1 |
| 5,422,194 | 6/1995 | Satoh et al. | 428/704 |

FOREIGN PATENT DOCUMENTS

| | | |
|---|---|---|
| 0298458 | 1/1989 | European Pat. Off. . |
| 63-161683 | 7/1988 | Japan .................. H01L 31/10 |

*Primary Examiner*—Stephone Allen
*Attorney, Agent, or Firm*—Hayes, Soloway, Hennessey, Grossman & Hage, P.C.

[57] ABSTRACT

A photoelectric conversion device is disclosed having a light shield layer made of a relatively low conductivity material. The light shield layer is provided on an insulating substrate and shades light passing through the insulating substrate toward the reverse surface of a photoelectric conversion layer such that light cannot reach the reverse surface of the photoelectric conversion layer directly.

8 Claims, 7 Drawing Sheets

PHOTOELECTRIC CONVERSION DEVICE FOR USE IN SENSING LIGHT REFLECTED FROM MEDIUM SURFACE

FIELD OF THE INVENTION

The invention relates to a photoelectric conversion device, especially to a complete joining type of photoelectric conversion device used for facsimile machines, digital copy machines, etc.

BACKGROUND OF THE INVENTION

A conventional photoelectric conversion device includes a transparent substrate, a light source joined to the reverse surface of the substrate, a photoelectric conversion layer, and electrodes provided above the photoelectric conversion layer.

In operation, light projected toward a copy surface of a paper passes through the substrate, and is reflected from the copy surface to the detecting surface of the photoelectric conversion layer. In response to the light received by the photoelectric conversion layer, a corresponding electric signal is generated. When the light is projected toward the paper, part of the light may go toward the reverse surface of the photoelectric conversion layer, which phenomenon should be prevented.

According to this conventional photoelectric conversion device, the gate electrode is used as a light shield layer to shade the light going toward the reverse surface of the photoelectric conversion layer. The gate electrode can be fabricated in the same processing as of the sensor (photoelectric conversion device) itself. However, charge-up condition may transiently occur at the gate electrode when photoelectric charge is generated during the photoelectric conversion. Therefore, capacitance is generated between the gate and source electrodes and the gate and drain electrodes, especially, an photoelectric charge based on the potential of the gate electrode may be accumulated on the surface of the MIS transistor. The accumulated photoelectric charge makes the level of output signal lower and response time slower.

Accordingly, an improved photoelectric conversion device has been described in Japanese Patent Publication Kokai S63-161683, in which gate and drain electrodes of the transistor are short-circuited to each other to keep the potential between the gate and a source stable. According to this photoelectric conversion device, no parasitic capacitance exists between the gate and drain, however, some parasitic capacitance exists between the gate and source; and therefore, the "γ-value" which is the gradient of logarithm of current vs logarithm of light intensity logalithm is reduced, and quick response has not been realized by the technique yet.

SUMMARY OF THE INVENTION

Accordingly, an object of the invention is to provide an improved photoelectric conversion device which operates quickly in response to incident light, and provides a higher level of electric output.

According to an aspect of the invention, the light shield layer provided on an insulating substrate is made of a relatively lower conductivity material for shading light passing through the insulation substrate toward the reverse surface of a photoelectric conversion layer so that the light cannot reach the reverse surface of the photoelectric conversion layer directly.

In practice, the photoelectric conversion device which receives light reflected from the surface of medium to be sensed, includes an insulating substrate; a photoelectric conversion layer which is provided with a receiving surface to which light reflected from the surface of medium to be sensed is supplied, and converts the received light into an electric signal; a light shield layer, provided on the insulating substrate, which is made of the relatively lower conductivity material for shading the light passing through the insulation substrate toward the reverse surface of the photoelectric conversion layer so that light cannot reach the reverse surface of the photoelectric conversion layer directly; an insulation layer provided between the light shield layer and the photoelectric conversion layer; a pair of electrodes provided on the photoelectric conversion layer; and a relatively low resistance layer provided between the photoelectric conversion layer and the pair of the electrodes for permitting ohmic-connection between the electrodes and the photoelectric conversion layer.

DESCRIPTION OF THE PREFERRED EMBODIMENTS

Figure 1:
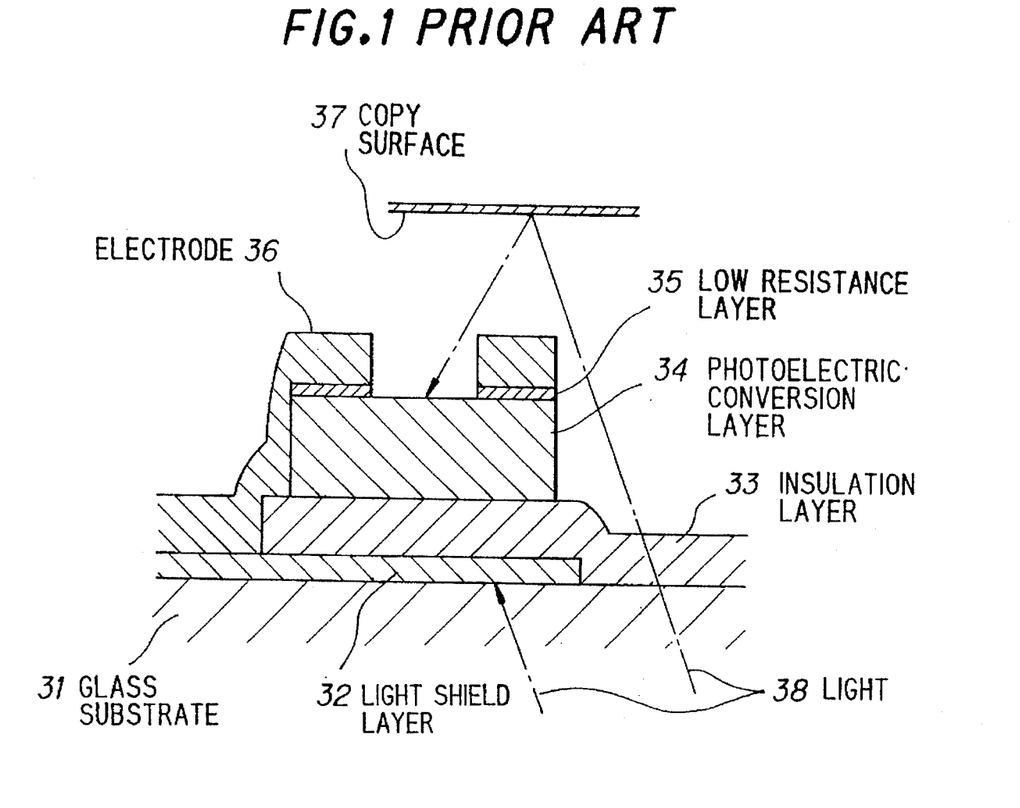
FIG. 1 is a cross-sectional view illustrating a conventional photoelectric conversion device.
Figure 2:
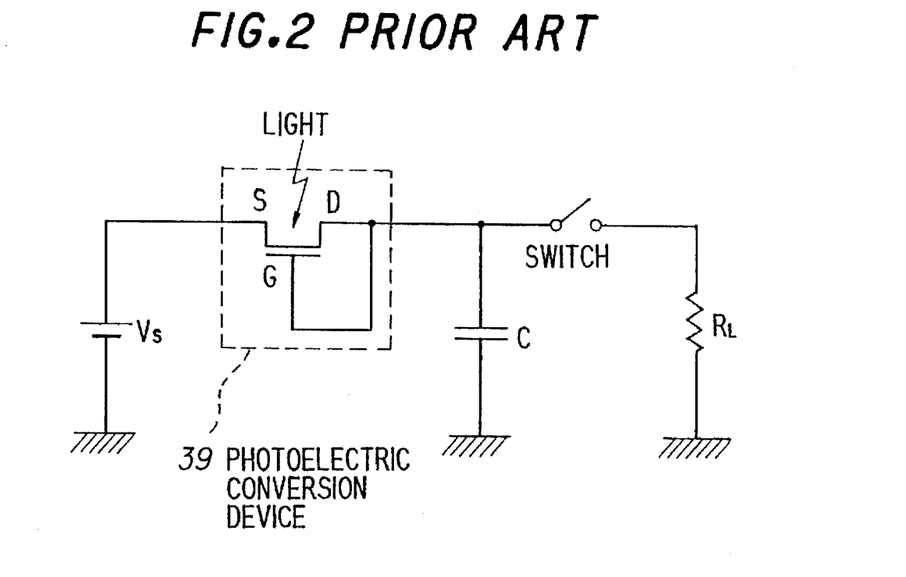
FIG. 2 is a schematic circuit diagram of the conventional photoelectric conversion device shown in FIG. 1.

For better understanding of the invention, conventional technology is first described in conjunction with FIGS. 1 and 2. A TFT type of conventional photoelectric conversion device includes a glass substrate 31 which is transparent, a light source (not shown) joined to the reverse surface of the glass substrate 31, a light shield layer 32, made of conductive material, which is provided on the glass substrate 31, an insulating layer 33 provided over the structure of the glass substrate 31 and the light shield layer 32, a photoelectric conversion layer 34 provided on the insulating layer 33, a relatively low resistance layer 35 provided on the photoelectric conversion layer 34 and electrodes 36 provided on the low resistance layer 35. The gate and drain electrodes of the transistor are short-circuited to each other to keep stable the potential between the gate and source.

In operation, light projected toward copy surface 37 of a paper passes through the glass substrate 31 and the insulation layer 33, and is reflected from the copy surface 37 to the upper surface of the photoelectric conversion layer 33. In response to the light received by the photoelectric conversion layer 33, a corresponding electric signal is generated. When the light is projected toward the paper, part of the light going toward the reverse surface of the photoelectric conversion layer 34 is shaded by the light shield layer 32.

According to the above described conventional photoelectric conversion device, no parasitic capacitance exists between the gate and drain, however, some parasitic capacitance exists between the gate and source; and therefore, the "γ-value" is reduced and quick response has not been realized by the technique yet.

Figure 3:
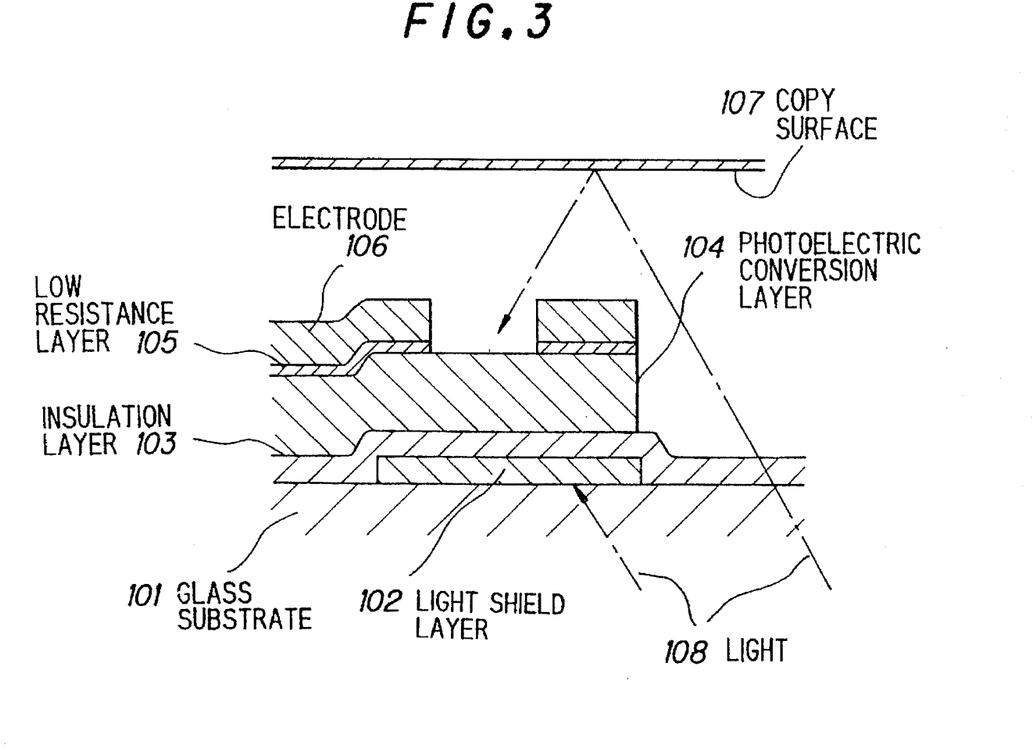
FIG. 3 is a cross-sectional view illustrating a photoelectric conversion device according to the invention.
Figure 4:
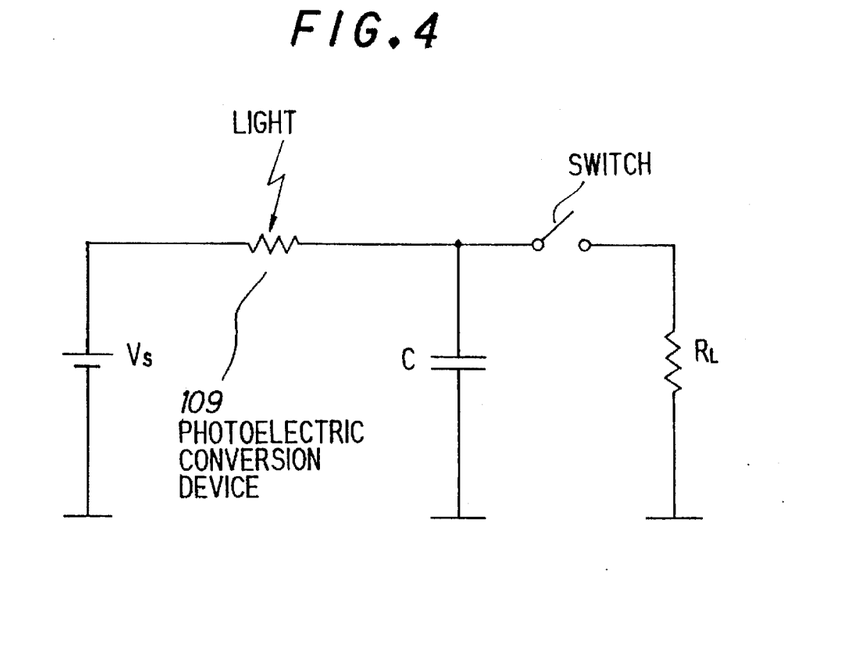
FIG. 4 is a schematic circuit diagram of the photoelectric conversion device shown in FIG. 3.

FIGS. 3 and 4 show a photoelectric conversion device 109 according to a first preferred embodiment of the invention, which includes a glass substrate 101 which is transparent, a light shield layer 102, made of polypyrrole, provided on the glass substrate 101, an insulation layer 103 provided over the light shield layer and glass substrate 102 and 101, a photoelectric conversion layer 104 provided on the insulation layer 103, a relatively low resistance layer 105 provided on the photoelectric layer 104, and electrodes 106 provided on the low resistance layer 105. The photoelectric conversion layer 104 and the electrodes 106 are ohmically-connected to each other.

Figure 6:
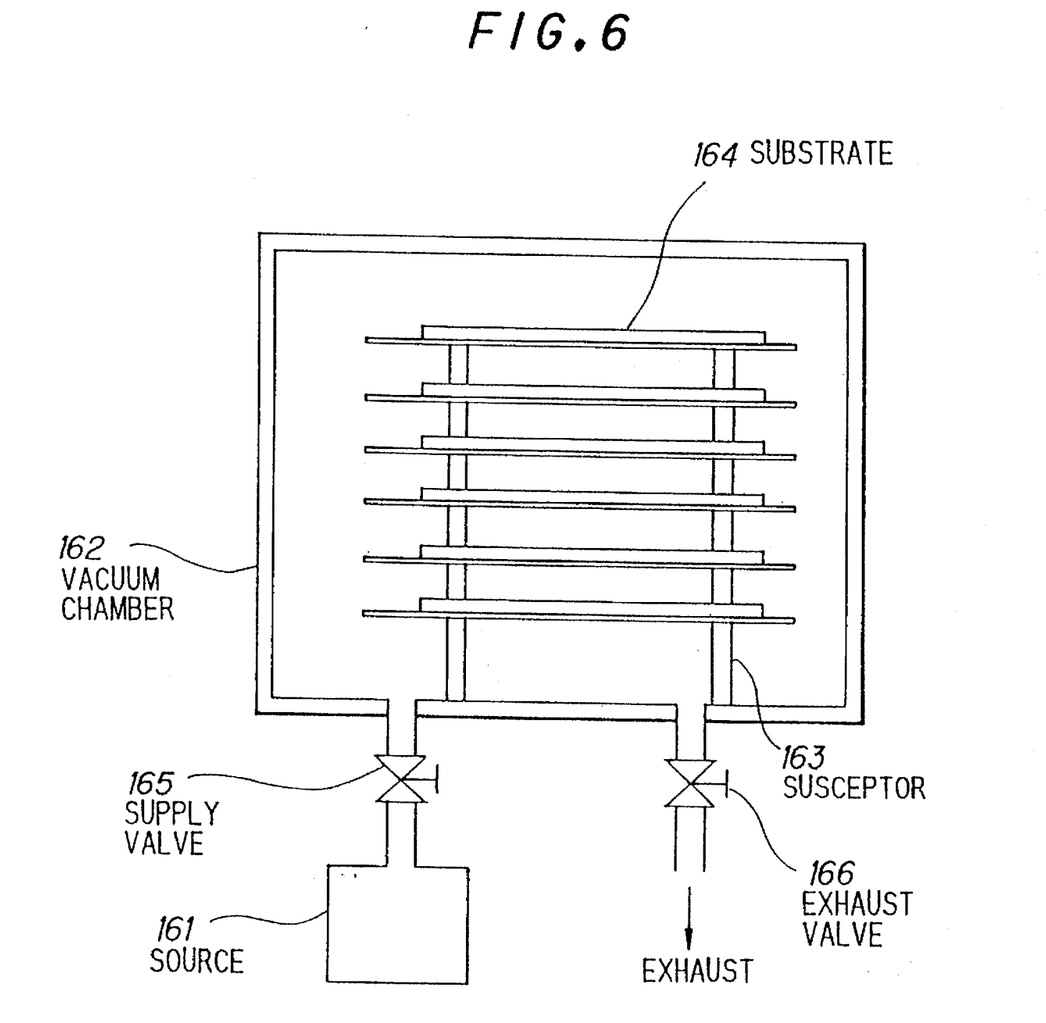
FIG. 6 is a simplified conceptual diagram showing an apparatus used in the fabrication of the photoelectric conversion device according to the invention.

In fabrication, 2% dodecile benzenesulfonic acid methanol solution is coated on the glass substrate 101 by a spinner. Glass substrates 164 with dodecile benzenesulfonic acid methanol are put on susceptors 163 enclosed in a vacuum chamber 162, as shown in FIG. 6. The evacuated chamber 162 is vacuumed by an exhaust valve 166 to 100 mTorr, then a supply valve is opened to evaporate pyrrole solution stored in a evaporation source 161. At this time, the vacuum chamber 162 is controlled to be at room-temperature and at 100 mTorr by the exhaust valve 166. The thickness of the polypyrrole layer varies in proportion to evaporation time. The deposition time is 10 to 20 A/sec, and the polypyrrole layer is made to have a thickness of 5000 A.

Figure 5A:
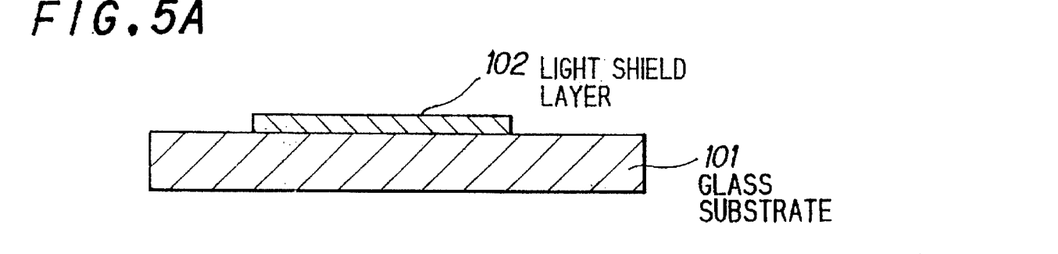
FIGS. 5A to 5D are cross-sectional diagrams illustrating fabrication steps of the photoelectric conversion device according to the invention.

Next, reaction products and reaction secondary products produced on the polypyrrole layer are cleaned out by methanol solution, then a photolithographic process is carried out, and then, the polypyrrole layer is patterned by a dry-etching process to make the light shield layer 102, as shown in FIG. 5A. The etching process is carried out with 40 SCCM of oxygen gas flowing at 200 mTorr of gas pressure, 5.70 milliwatts per square centimeter of discharge output for 15 minutes. As described above, the light shield layer 102 can be mass-produced easily as compared to plasma CVD and sputtering processing.

Figure 5B:
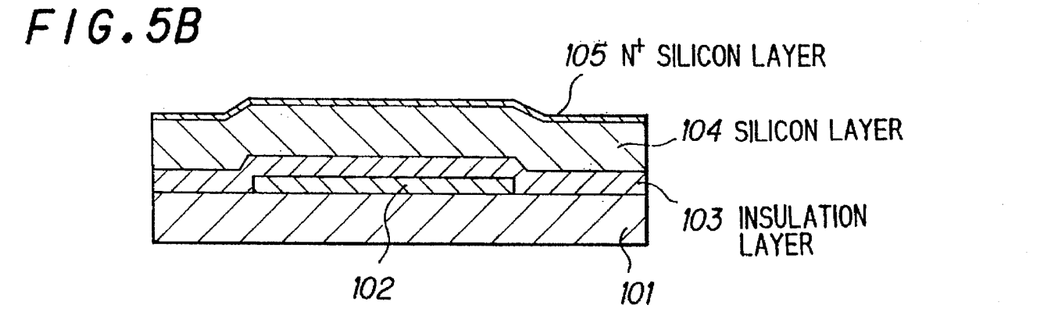

Next, an silicon oxide layer (insulation layer) 103 is produced over the glass substrate 101 and the light shield layer 102 so as to have a thickness of 3000 A, as shown in FIG. 5B. In this step, the structure is heated to 300° C. in an additional evacuated heating chamber to make the polypyrrole insulated and the oxide layer is produced without exposing the glass substrate to air.

Figure 5C:
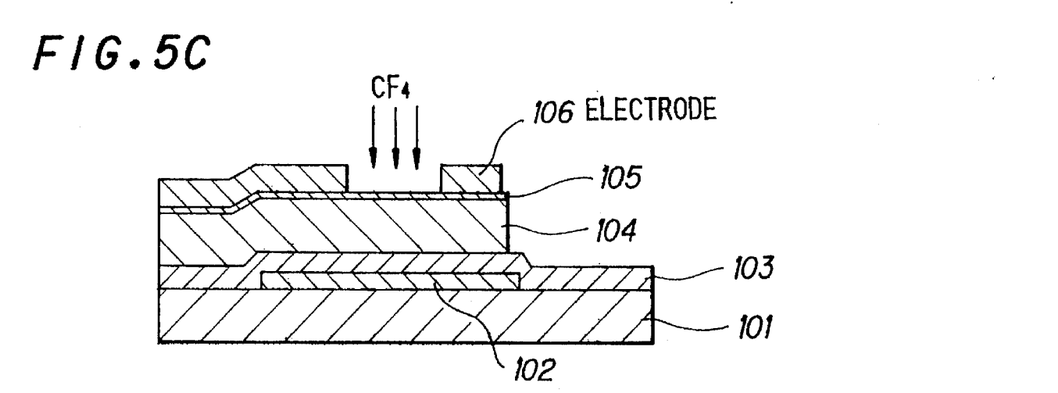
Figure 5D:
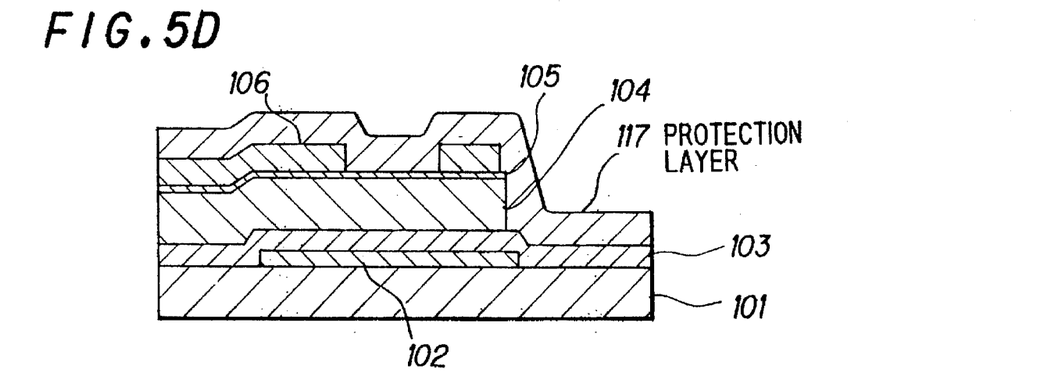

Subsequently, an amorphous silicon layer (104) is formed for the photoelectric conversion layer 104 having a thickness of 4000 A, and an n+ silicon layer (105) is formed for the low resistance layer 105 having a thickness of 400 A, as shown in FIG. 5B. The amorphous silicon layer is islanded, then chrome is sputtered on the low resistance layer 105, and then the electrodes 106 are formed by PR processing. Next, the n+ layer formed on the photoelectric conversion layer 104 is dry-etched, as shown in FIG. 5C. A protection layer 117, which is of silicon nitride, is provided over the entire structure to make a complete device, as shown in FIG. 5D.

Figure 7:
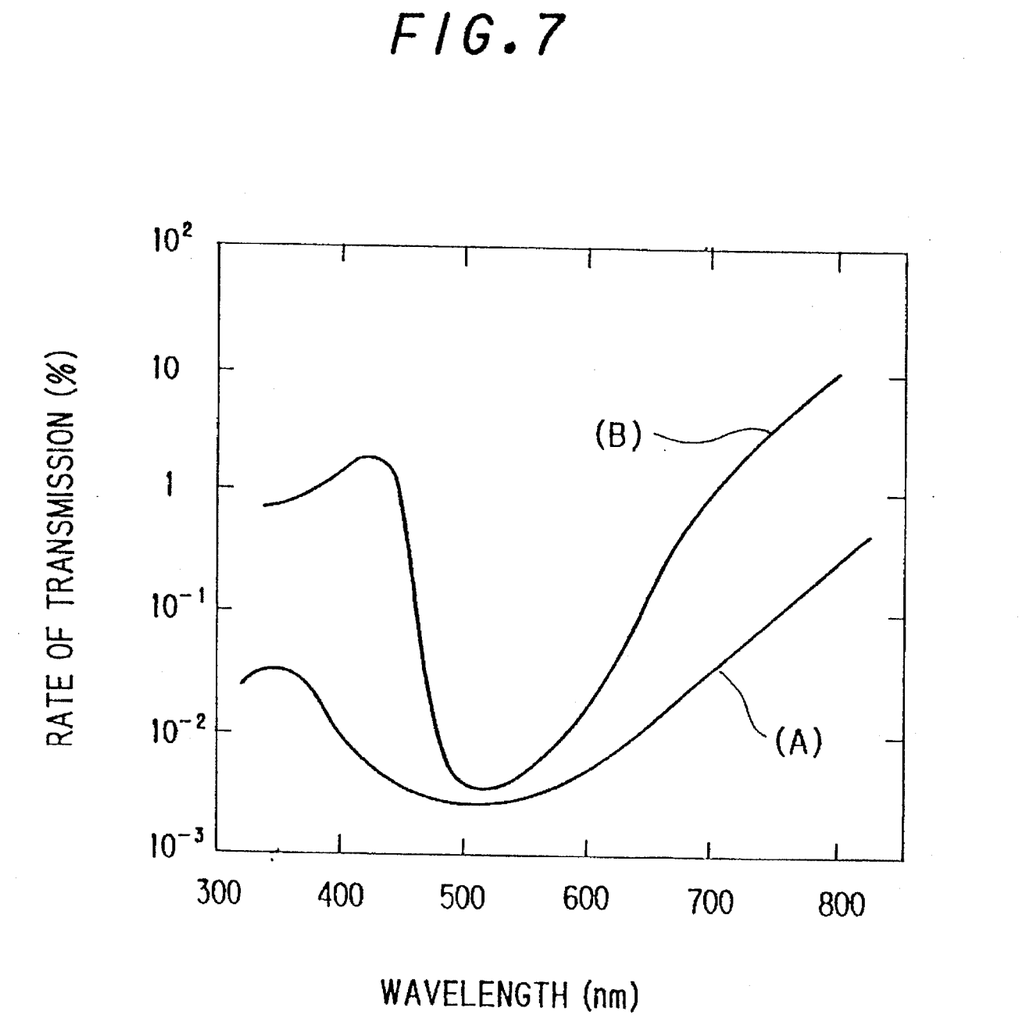
FIGS. 7 to 11 are graphs showing the operation of the photoelectric conversion device according to the invention.

In FIG. 7, line (A) shows the rate of transmission of polypyrrole. According to the above mentioned photoelectric conversion device, response time is 0.5 to 0.95 msec for each of on and off, and value of the ratio of photo current to dark current (Ip/Id) is more than 1000 on average when the incident light window is L=500 μm and W=8 μm.

Next, a second preferred embodiment according to the invention is now described, in which a light shield layer is made of polyanilin while the other components are the same as those of the first preferred embodiment. In production of the light shield layer of polyanilin, 1 mol/l of anilin is melted in 1 mol/l of paratoluene-sulfonic acid solution, then the same mol of ammonium dichromate is added therein as oxidizing material, and then the solution is stirred at 0° C. for two hours to produce black polyanilin. The polyanilin is cleaned with ammonia water, then filtered, then added to N-methylpyrrolidone. Non melted components are filtered from the solution to make polyanilin solution. Then, 0.1 mol % of hydrochloric acid is added into each monomer unit of the polyanilin solution, and the solution is coated on a glass substrate by a spinner, and the coated substrate is annealed at 150° C. and 100 mTorr. The polyanilin layer is formed by the spinner at 30 rpm of for 10 minutes, 400 rpm for 30 minutes and 1000 rpm for 55 minutes so that the layer has a thickness of 5000 A. The thickness distribution is 5150±3% on the glass substrate of 150×150 mm, and the distribution of transmission rate is less than 0.01% with light having a wavelength of 570 nm. The rate of transmission for a light shield layer having a thickness of 5000 A with light having a wavelength of 300 to 800 nm is as shown by a line (B) in FIG. 7.

After photolithographic processing in the same manner as that for the first preferred embodiment, the polyanilin layer is patterned by dry-etching with 50 SCCM of oxygen gas flowing at 200 mTorr of gas pressure, 5.20 milliwatts per square centimeter of discharge output for 7.0 minutes. After the patterning, a silicon oxide layer is formed on the polyanilin layer to have a thickness of 2000 A by heating to 150° C. for 20 minutes in a heating vacuum chamber of a sputtering apparatus. Because the following steps for fabricating the photoelectric conversion device are the same as those of the first preferred embodiment, they are not described here. According to the above mentioned photoelectric conversion device, response time is 0.5 to 1.0 msec for each of on and off, value of the ratio of photo current to dark current (Ip/Id) is more than 1000. As mentioned above, the polyanilin layer can be produced easily by a simple mixing method.

Figure 8:
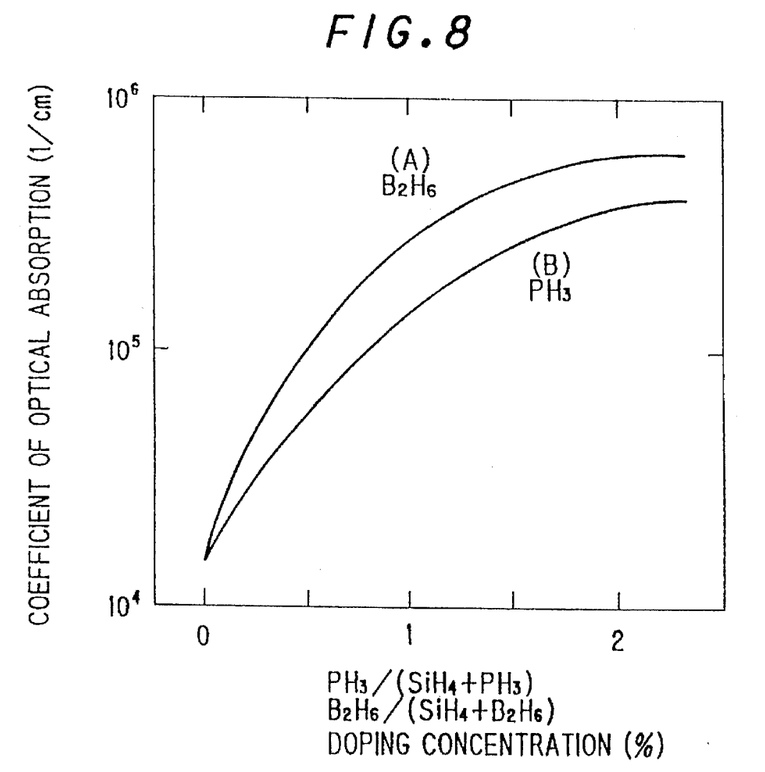
Figure 9:
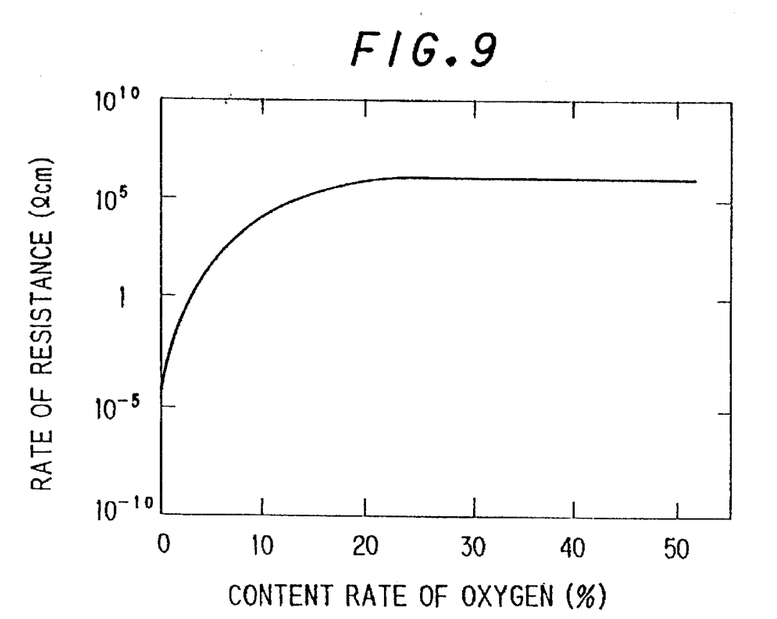

Next, a third preferred embodiment according to the invention is now described, in which silicon is used for the light shield layer. In fabrication, an "n+" or "p+" type of amorphous silicon layer is formed on a glass substrate, then phosphorus or boron is doped therein in order to obtain a proper coefficient of light absorption. If the light shield layer has a thickness of more than 3500 A and a coefficient of light absorption is $2 \times 10^5 (cm^{-1})$ relative to light having a wavelength of 570 nm, the rate of light transmission of the light shield layer is going to be less than 0.1%. FIG. 8 shows the relation between coefficient of optical absorption and doping concentration. A layer of $B_2H_6$ indicated by a line (A) and a layer of $PH_3$ have more than $2 \times 10^5 (cm^{-1})$ when the doping concentration is more than 0.6% and 1%, respectively. The thickness of the light shield layer is 3700 A.

Because the following steps for fabricating the photoelectric conversion device are the same as those of the first preferred embodiment, they are not described here. According to the above mentioned photoelectric conversion device, response time is less than 1.0 msec for each of on and off, value of the ratio of photo current to dark current (Ip/Id) is more than 1000. As mentioned above, the semiconductor light shield layer is produced by a plasma CVD method, so that a machine for another step can be used to produce the light shield layer also.

Next, a fourth preferred embodiment according to the invention is now described, in which chrome oxide is used for a light shield layer. In fabrication, chrome oxide is sputtered on a glass substrate with argon and oxygen gas at a substrate temperature of 220° C. of, with 5 SCCM and 8 SCCM of argon and oxygen gas, respectively, at flowing pressure of $1.6 \times 10^{-3}$ Torr, at 15 cm/min of delivering speed to have a thickness of 3000 A. The chrome oxide layer is patterned by dry-etching using a photo-resist pattern with a 50 SCCM and 30 SCCM of methane tetra-fluoride and oxygen gas, respectively, at a 200 mTorr of gas pressure, at 5 milliwatts per square centimeter of discharge output for 18.0 minutes.

Because the following steps for fabricating the photoelectric conversion device are the same as those of the first preferred embodiment, they are not described here. According to the above mentioned photoelectric conversion device, response time is less than 1.0 msec for each of on and off, value of the ratio of photo current to dark current (Ip/Id) is more than 1000. As mentioned above, the semiconductor light shield layer is produced by sputtering with a conventional apparatus producing electrodes. Further, it is easy to respond to problems of impurities.

Next, a fifth preferred embodiment according to the invention is now described, in which chrome oxide is used for the light shield layer. In fabrication, chrome layer is formed on a glass substrate by sputtering so as to have a thickness of 1000 A, and then the chrome layer is patterned by PR processing. After that, the structure is left in atmosphere of nitrogen basis with 10% oxygen, at 350° C. for one hour to form a chrome oxide layer having a thickness of 300 to 500 A on the chrome layer.

Figure 10:
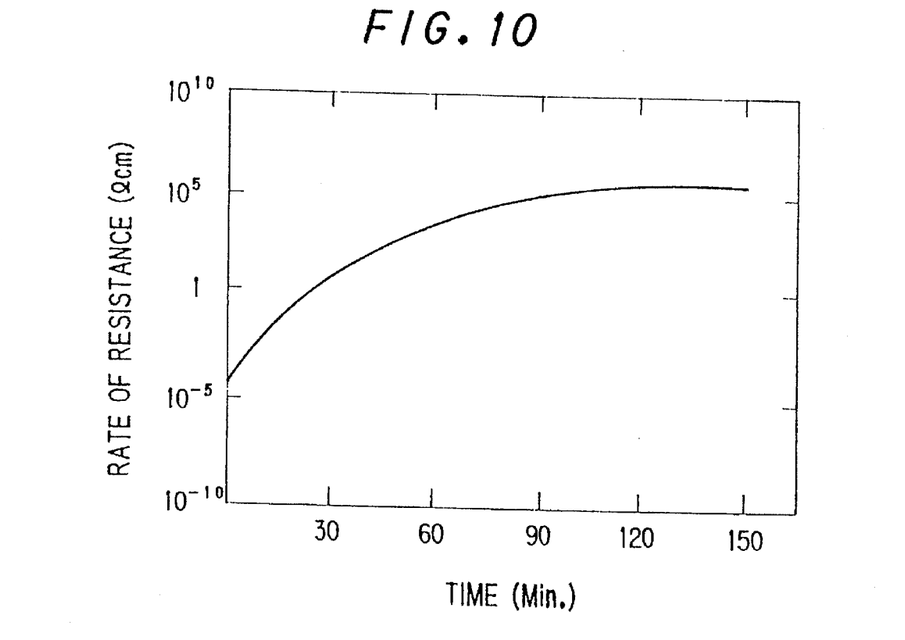

FIG. 10 shows variation of the rate of resistance of a chrome oxide layer relative to annealing time. The chrome oxide layer formed by heat-oxidization on the chrome layer has a rate of resistance in the range of $10^5$ to $10^6$ ($\Omega$cm). A silicon nitride layer, an amorphous silicon layer and an n+ layer are provided in the same manner as that in the first preferred embodiment.

According to the above mentioned photoelectric conversion device, which is fabricated so as to be the same size as the first preferred embodiment, response time is less than 0.8 msec for each of on and off, value of the ratio of photo current to dark current (Ip/Id) is more than 1000. The chrome oxide layer may be formed by using chrome oxide target. The chrome oxide layer is good for shading, and a conventional TFT machine can be used in common. In the fourth and fifth preferred embodiments, gate electrodes are preferably formed after formation of light shield layers.

The first to fifth preferred embodiments are applicable not only to photoelectric conversion devices but also to switch devices, such as TFTs. For fabricating a TFT in the first to third preferred embodiments, a gate electrode is formed by chrome-sputtering, then the electrode is patterned, and then an organic layer, p+ or n+ layer is formed. The gate electrode may be formed after the organic layer, p+ or n+ layer is formed.

In the first to fifth preferred embodiments, it is necessary to form an insulating oxide layer or nitride layer after the light shield layer has been formed in order to prevent the light shield layer from generating impurities therefrom and from being broken away.

Figure 11:
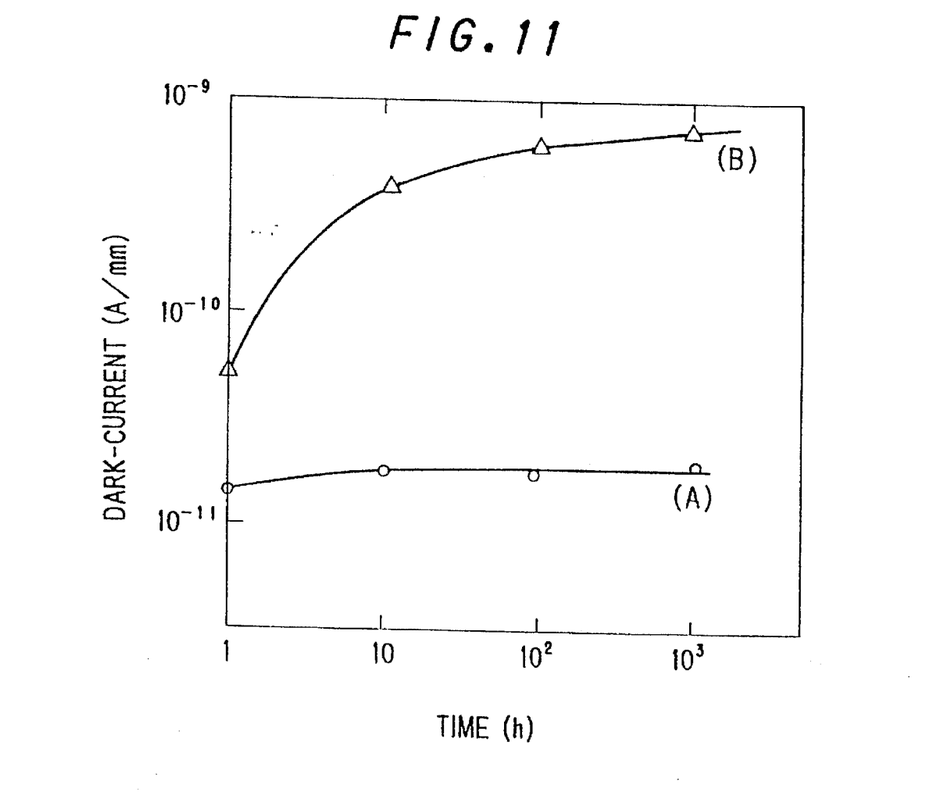

FIG. 11 shows the relation between dark-current and time, in which a line (A) indicates the case when a silicon oxide layer having a thickness of 3000 A is formed on the light shield layer and a line (B) indicates the case when the photoelectric conversion layer is directly formed on the light shield layer. Concerning line (B), impurities go out from the surface between the shading and photoelectric conversion layers into the photoelectric conversion layer, and therefore, the photoelectric conversion layer is changed in properties. As the insulating layer, a nitrogen oxide layer and a layer including carbon may be used.

As described above, according to the invention, the voltage potential of the light shield layer is not affected by that of the source or drain of the photoelectric conversion layer, because the light shield layer is made of non-metal or non-well conducting material. And therefore, less than one millisecond of response time and more than 1000 of brightness ratio can be obtained.

When an organic polymer is used for the light shield layer, there are advantages in that the layer can be formed easily as compared to other materials formed by sputtering and CVD methods, and the polymer is easily mixed with other material. Especially with polypyrrole, batch processing is possible, and polyanilin is easily mixed with other material.

When a silicon semiconductor layer is doped with phosphine or diborane to make a high light absorbent layer, there is an advantage in that the device can be made by a machine originally used for making semiconductor layers, such as in TFT and diodes.

When a chrome oxide layer is used as the light shield layer, there are advantages in that chrome itself is oxidized easily and has a higher resistance of more than $10^5$($\Omega$cm). For oxidization, a chrome layer can be oxidized in a process for providing an electrode. Further, the same equipment can be used commonly if sputtering is carried out mixing oxygen.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A photoelectric conversion device for receiving light reflected from a surface of a medium to be sensed, comprising:

an insulating substrate;

a photoelectric conversion layer having a receiving surface to which the light reflected from the surface of the medium to be sensed is supplied, said photoelectric conversion layer being for converting the received light into an electric signal;

a light shield layer, provided on the insulating substrate, which is made of a first material for shading a portion of the received light passing through the insulating substrate toward a reverse surface of the photoelectric conversion layer so that the portion of received light cannot reach the reverse surface of the photoelectric conversion layer directly;

an insulating layer provided between the light shield layer and the photoelectric conversion layer;

a pair of electrodes provided on the photoelectric conversion layer; and a layer of a second material provided between the photoelectric conversion layer and the pair of the electrodes for ohmic-connecting the electrodes to the photoelectric conversion layer;

wherein said first material includes one of nonconductive organic high molecular and oxidized metal; and wherein said device is adapted (a) to have a response time of less than 1.0 msec for each of an on state and an off, and (b) to have a ratio of photocurrent to dark current of greater than 1000.

2. The photoelectric conversion device, according to claim 1, wherein:

said nonconductive organic high molecular is of polypyrrole.

3. The photoelectric conversion device, according to claim 1, wherein:

said nonconductive organic high molecular is of polyanilin.

4. The photoelectric conversion device according to claim 1, wherein:

said first material comprises semiconductor material substantially composed of silicon.

5. The photoelectric conversion device, according to claim 4, wherein:

said semiconductor material is of "n" type.

6. The photoelectric conversion device, according to claim 4, wherein:

said semiconductor material is of "p" type.

7. The photoelectric conversion device, according to claim 1, wherein:

said oxidized metal is oxidized chrome.

8. The photoelectric conversion device, according to claim 7, wherein (a) said light shield layer comprises a chrome oxide layer disposed on a chrome layer, said chrome oxide layer having (i) a thickness between 300 and 500 angstroms and (ii) a resistance between $10^5$ and $10^6$ ohm-cm, and (b) said response time is less than 0.8 msec.

* * * * *